United States Patent
Bourlier et al.

(10) Patent No.: US 10,428,435 B2
(45) Date of Patent: Oct. 1, 2019

(54) METHOD FOR MODIFYING AN ELECTRICALLY CONDUCTIVE OXIDE SURFACE, USE FOR ELECTRODEPOSITION OF COPPER ON SAID SURFACE

(71) Applicant: COMMISSARIAT A L'ENERGIE ATOMIQUE ET AUX ENERGIES ALTERNATIVES, Paris (FR)

(72) Inventors: Yoan Bourlier, Viroflay (FR); Thomas Berthelot, Les Ulis (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/488,056

(22) Filed: Apr. 14, 2017

(65) Prior Publication Data

US 2017/0298525 A1    Oct. 19, 2017

(30) Foreign Application Priority Data

Apr. 15, 2016 (FR) ...................... 16 53345

(51) Int. Cl.
*C25D 3/38* (2006.01)
*C25D 5/00* (2006.01)
(Continued)

(52) U.S. Cl.
CPC .................. *C25D 3/38* (2013.01); *C25C 5/02* (2013.01); *C25D 5/00* (2013.01); *C25D 5/02* (2013.01);
(Continued)

(58) Field of Classification Search
CPC ..... C23C 18/1637; C23C 18/38; C23C 18/40; C23C 18/1639; C23C 18/1642;
(Continued)

(56) References Cited

U.S. PATENT DOCUMENTS

| 4,586,988 A | 5/1986 | Nath et al. |
| 2011/0256413 A1* | 10/2011 | Roussel ............... C23C 18/1653 428/457 |
| 2015/0349152 A1* | 12/2015 | Voss ........................ H01L 24/11 136/256 |

FOREIGN PATENT DOCUMENTS

WO    WO 2007/034116 A2    3/2007

OTHER PUBLICATIONS

French Preliminary Search Report dated Nov. 7, 2016 in French Application 16 53345 filed on Apr. 15, 2016 (with English Translation of Categories of Cited Documents).
(Continued)

*Primary Examiner* — Louis J Rufo
(74) *Attorney, Agent, or Firm* — Oblon, McClelland, Maier & Neustadt, L.L.P.

(57) ABSTRACT

The present invention relates to a method for modifying the surface of a substrate made of electrically conductive metal oxide and notably made of ITO, comprising the following steps consisting in: (i) bringing into contact said surface with a solution containing copper ions ($Cu^{2+}$) and ammonia then washing and optionally drying the surface thus obtained; and (ii) bringing into contact the surface obtained following step (i) with a solution containing sodium tetraborohydride then washing and optionally drying the surface of said conductive metal oxide substrate. The present invention relates to the use of such a method within the scope of the metallization by copper of a conductive metal oxide substrate as well as the surfaces of a modified and metallized conductive metal oxide substrate thus obtained.

17 Claims, 11 Drawing Sheets

(51) Int. Cl.
  *C25D 5/02* (2006.01)
  *H01L 31/0224* (2006.01)
  *C25D 7/12* (2006.01)
  *C25C 5/02* (2006.01)
  *C25D 5/38* (2006.01)

(52) U.S. Cl.
  CPC ............ *C25D 5/022* (2013.01); *C25D 5/38* (2013.01); *C25D 7/126* (2013.01); *H01L 31/022466* (2013.01)

(58) Field of Classification Search
  CPC ... C23C 18/1658; C23C 18/1635; C25D 5/34; C25D 5/38; C25D 5/02; C25D 5/022; C25D 5/00; C25D 3/38; C25D 7/123; C25C 5/02; H01L 31/022466
  See application file for complete search history.

(56) References Cited

OTHER PUBLICATIONS

Jae Jeong Kim et al. "Optimized Surface Treatment of Indium Tin Oxide (ITO) for Copper Electroless Plating", Japanese Journal of Applied Physics. vol. 41., No. 11A, Nov. 1, 2002, pp. 4.
Ankit Khanna et al. "Screen-printed masking of transparent conductive oxide layers for copper plating of silicon heterojunction cells", Applied Surface Science, vol. 349, May 21, 2015, pp. 8.
U.S. Appl. No. 14/005,116, filed Nov. 1, 2013, US 2014-0044884 A1, Thomas Berthelot et al.
U.S. Appl. No. 14/365,377, filed Jun. 13, 2014, US 2014-0349279 A1, Thomas Berthelot et al.
U.S. Appl. No. 14/971,045, filed Dec. 16, 2015, US 2016-0178544 A1, Alexandre Causier et al.
Jonas Bartsch et al., "21.8% efficient n-type solar cells with industrially feasible plated metallization", 4th International Conference on Silicon Photovoltaics, Energy Procedia, vol. 55, 2014, pp. 401-409 (with cover page).
Christian Geisler et al., "Continuous wave laser processing for electrical and mechanical stable solar cells with Ni—Cu metallization", 4th International Conference on Silicon Photovoltaics, Energy Procedia, vol. 55, 2014, pp. 665-669 (with cover page).
Jose Luis Hernández et al., "High Efficiency Copper Electroplated Heterojunction Solar Cells and Modules—The Path Towards 25% Cell Efficiency", 28th European Photovoltaic Solar Energy Conference and Exhibition, 2013, pp. 741-743.
Loic Tous et al., "Large-area hybrid silicon heterojunction solar cells with Ni/Cu plated front contacts", 4th International Conference on Silicon Photovoltaics, Energy Procedia, vol. 55, 2014, pp. 716-723 (with cover page).
Jonas Geissbuhler et al., "Silicon Heterojunction Solar Cells With Copper-Plated Grid Electrodes: Status and Comparison With Silver Thick-Film Techniques", IEEE Journal of Photovoltaics, vol. 4, No. 4, 2014, pp. 1055-1062.
P. Papet et al., "Heterojunction Solar Cells With Electroplated Ni/Cu Front Electrode", 28th European Photovoltaic Solar Energy Conference and Exhibition. 2013, pp. 1976-1979.
Keiichiro Masuko et al,, "Achievement of More Than 25% Conversion Efficiency With Crystalline Silicon Heterojunction Solar Cell", IEEE Journal of Photovoltaics, vol. 4, No. 6, 2014, pp. 1433-1435.

* cited by examiner

Background Art

METHOD FOR MODIFYING AN ELECTRICALLY CONDUCTIVE OXIDE SURFACE, USE FOR ELECTRODEPOSITION OF COPPER ON SAID SURFACE

TECHNICAL FIELD

The invention pertains to the physical-chemical field of materials and more specifically to the metallisation of electrically conductive oxide surfaces such as ITO (Indium Tin Oxide) surfaces.

Firstly, the present invention relates to a method for forming, on the surface of an electrically conductive oxide substrate, a film of copper metal without adhesion layer and without seed layer by subjecting beforehand the surface of the electrically conductive oxide substrate to a two-step treatment modifying the physical-chemical properties of said surface. The present invention also relates to the method of modification per se.

Finally, the present invention relates to the surfaces of an electrically conductive oxide substrate modified and metallised by implementation of these methods as well as the different uses thereof, notably in the field of photovoltaic cells.

PRIOR ART

Photovoltaic cells (PV cells) are devices capable of converting solar energy into electrical energy thanks to the use of semiconductor materials, to produce a photovoltaic effect. Reducing the cost price of PV cells could promise a bright future for the entire industry. More than 30% of the production cost is today attributed to the formation of metal contacts. Paradoxically, the electrical losses due to these same contacts are also of the order of 30%. It may thus be envisaged to increase the performance of heterojunction PV cells while reducing the cost thereof, without attacking the structures thereof, but simply by improving the metal contact grid on the surface.

The majority of metal contacts of heterojunction PV cells are produced by silver paste screen printing at low temperature (<200° C.). This method is rapid and has good reproducibility. It is, hence, easily industrialisable. However, the price of silver remains very high, which enormously increases the cost price. In addition, screen printing uses an enormous amount of material compared to other methods and it gives rise to metallisation lines that are too wide (between 80 µm and 100 µm), which leads to significant shading effects.

The alternatives to silver paste screen printing proposed are thus based on two considerations, namely (i) the deposition technique and (ii) the material to deposit.

In this second case, the best candidate for replacing silver is certainly copper since it has very low resistivity (1.68 µΩ·cm) equivalent to that of silver (1.59 µΩ·cm) while being 100 times cheaper than silver.

For the deposition of copper contacts, copper based screen printing pastes, low temperature inks and flash sintering based on nanoparticles of copper have been developed; however the resistivity of the lines remains high i.e. above 20µΩ·cm.

Two other methods derived from electrochemistry are also used to deposit copper contacts. They are particularly interesting due to the fact that they confer, on the metallisation grid, very low resistivity, i.e. of the order of 2 µΩ·cm. These methods are, on the one hand, the ECD (Electro-Chemical Deposition) method and, on the other hand, the LIP (Light Induced Plating) method. The ECD method consists in reducing metal salts present in the electrolyte on the surface of the PV cell and this is done by applying an electrical current. As for the LIP method, it is based on the same chemical principles but involves the photovoltaic properties of the PV cell. Thus, the latter is subjected to an illumination and itself induces the current required for the reduction of metal salts on the surface.

The ECD and LIP methods have numerous advantages compared to printing techniques: they enable dense depositions and of high purity, with a resistivity equivalent to that of bulk metals. In addition, the quantity of metal used by these methods is minimised. A first disadvantage encountered for any method by immersion is that the patterns of the contact grid are not produced directly in comparison with other printing methods. It is thus necessary to carry out a step of surface masking of the PV cell.

The LIP method appears as an efficient means of metallising solar cells and is well suited to depositions of copper, the efficiency record of metallised cells with copper according to the LIP method reaching 21.8% [1]. However, this method remains very little used in the case of heterojunction cells. In fact, for electrical reasons, the LIP method can only be carried out on the n-doped side of the cell. In the case of a heterojunction cell, the metal grid on the front face is connected to the p-doped face (unlike a silicon homojunction cell), thus making the LIP method impossible and only applicable on the rear face. In addition, the electrodeposition of copper according to the LIP method is not directly applicable on the surface of the ITO due to problems of adhesion and the presence of an adhesion layer is necessary.

The ECD method stems from the technology of silicon homojunction cells for which the imprint of the contact lines is hollowed out in the surface of the anti-reflection layer (or ARC for Anti Reflection Coating) by laser ablation [2]. The EDC method was next transferred to heterojunction PV cells [3-4]. Masking by laser ablation is replaced therein by photolithography, either by printing of a resin mask, or by ink jet printing on resin. The presence of ITO on the surface of the heterojunction PV cell constitutes in itself a barrier against the diffusion of copper. However, the electrodeposition of copper is apparently not directly applicable on the surface of the ITO due to problems of adhesion [5]. The electrodeposition of nickel no longer acting as diffusion barrier then becomes the adhesion layer the most often employed. The nickel then serves as transition between the oxide, which is mainly constituted of indium (>90%), and the reduced copper on the surface.

The performances of heterojunction PV cells metallised by ECD reach, at present, 24.2% [3] in the laboratory and 22.3% on large surface modules (cell of 153 cm$^2$) [6]. This ECD method currently used in the literature is designated "Ni—Cu ECD" method (FIG. 1A). Although having numerous advantages such as described above, the Ni—Cu ECD method can compete with difficulty against the technology of silver paste screen printing. Two main limitations are concerned: the number of steps required for the production of the metal contacts, which constitutes an incontestable economic constraint, and the ITO/Ni/Cu contact resistance which is too high for the PV cells derived from this method to reach the record electrical performances of heterojunction cells with silver metal contacts (reaching 25.6%) [7].

In order to improve the electrical performances of the PV cell, an ECD method using exclusively copper has been developed, said method being designated "Cu ECD" (FIG. 1B). On account of the lower resistivity of copper compared to nickel, the ITO/Cu electrical contact will be more efficient than the ITO/Ni/Cu contact. The adhesion layer used by the Cu ECD method is a thin layer of around 50 nm of copper metal deposited by PVD (Physical Vapour Deposition). This step of physical deposition under vacuum (dry process) is not only very expensive and difficult to incorporate in a production line, but it also requires an additional step of RIE (Reactive Ion Etching) at the end of the method to eliminate the copper on the non-metallised ITO layer.

To date, no method making it possible to reduce drastically the production costs linked to the metallisation of photovoltaic cells has emerged. In fact, the use of nickel offers good adhesion of the metal contacts but the latter constitutes a brake to the electrical efficiency of the cell due to its higher resistivity than that of copper (8.7 $\Omega \cdot$cm for Ni compared to 1.7 $\Omega \cdot$cm for Cu). The Cu ECD method currently implemented makes it possible to do without nickel but it involves physical deposition steps that are impossible to implement in a production line because far too expensive.

The inventors thus set themselves the goal of proposing a method for the production of heterojunction photovoltaic cells that is easy to implement, inexpensive and thanks to which cells are obtained of which the electrical efficiencies make it possible to envisage an industrial exploitation.

DESCRIPTION OF THE INVENTION

The inventors have achieved the goal set by proposing a method of electrodeposition, in direct solution, of copper metal on ITO. This method makes it possible to form, in solution, copper metal on the surface of a material covered with ITO without creation of a barrier sub-layer and without prior deposition of an adhesion primer. This copper layer has an intimacy with the ITO structured or not making it possible notably to ensure an optimal transfer of electrons between these two layers.

In order to develop a competitive and industrialisable method of metallisation of ITO surfaces which preserves the ITO/Cu electrical contact, the inventors have developed a method using exclusively the chemistry of solutions (wet process) in order to modify the ITO surface after masking, thus eliminating all the "dry process" steps of methods of the prior art.

More particularly, the inventors have developed a two-step chemical method thanks to which the physical-chemical properties of the ITO layer are surface modified. This modification method implements successively a first bath containing copper sulphate and ammonia and a second bath containing sodium tetraborohydride.

Several tests of electrodeposition of copper directly on a PV cell with ITO surface and without prior chemical treatment have enabled the inventors to verify the total absence of adhesion of the films of Cu on the ITO, in accordance with the observations described in the literature [6,8]. Only the modification of the ITO surface by successively bringing it into contact with the two baths described above is at the origin of the good adhesion of the copper film formed on the ITO surface.

Without wishing to be held by any theory, it may be assumed that bringing the ITO surface into contact with the first bath enables the creation of "ligands" between the $[Cu(NH_3)_4]^{2+}$ complexes and said surface. Only copper-ammonia complexes are assumed to enable an interaction with the ITO film, for example, with metal-hydroxide and notably In—OH dangling bonds at the surface of the ITO film. The second step involves a bath containing $NaBH_4$, which is a powerful reducing agent. The inventors have noted that the combination of these two steps enables the structuring and the chemical modification of the ITO rather than the appearance of nanoparticles or clusters of copper on the surface (cf. experimental part hereafter).

Finally, it is worth pointing out that the choice of the constituents of the different baths implemented in the modification method according to the invention is not at all arbitrary. In fact, only the combination of the two steps involving a first bath containing copper sulphate and ammonia and a second bath containing sodium tetraborohydride enables modification of the ITO surface. Other bath formulations were tested with, for the first bath, notably baths containing nickel and ammonia and/or, for the second bath, other reducing agents such as hypophosphorous acid ($H_3PO_2$), dimethyl-amino-borane (DMAB) or ascorbic acid ($C_6H_8O_6$) without result. Only the elements constituting the two baths defined above make it possible to obtain a physical-chemical modification of the ITO surface thanks to which good adhesion with the film of electrodeposited copper metal is obtained.

In a particularly interesting manner, the method according to the present invention applies not only to ITO substrates but also to any electrically conductive metal oxide substrate whether said substrate is opaque or transparent such as TCO (Transparent Conductive Oxide) substrates.

The present invention thus relates to, firstly, a method for modifying the surface of an electrically conductive metal oxide substrate, said method comprising the following steps consisting in:

i) bringing into contact the surface of said electrically conductive metal oxide substrate with a solution containing at least one copper ion ($Cu^{2+}$) and at least ammonia then washing and optionally drying the surface of said electrically conductive metal oxide substrate thus obtained;

ii) bringing into contact the surface of said electrically conductive metal oxide substrate obtained following step (i) with a solution containing sodium tetraborohydride then washing and optionally drying the surface of said electrically conductive metal oxide substrate.

Whereby the surface that is obtained following step (ii) is a modified surface of an electrically conductive metal oxide substrate.

The electrically conductive metal oxide implemented within the scope of the present invention may be opaque or transparent in the visible and the near infrared. Advantageously, said conductive metal oxide is transparent in the visible and the near infrared. Thus, the conductive metal oxide implemented within the scope of the present invention is a transparent conductive oxide (TCO).

The electrically conductive metal oxide implemented within the scope of the present invention is selected from the group consisting of an indium oxide optionally doped, a tin oxide optionally doped, a zinc oxide optionally doped, a cadmium oxide optionally doped, a gallium oxide optionally doped, a thallium oxide optionally doped, a lead oxide optionally doped, an antimony oxide optionally doped, a niobium oxide optionally doped, a tungsten oxide optionally doped, a zirconium oxide optionally doped, a ruthenium oxide optionally doped, a barium oxide optionally doped, a selenium oxide optionally doped, a bismuth oxide optionally doped and mixtures thereof.

"Optionally doped" is taken to mean an electrically conductive metal oxide further comprising a constituent capable of doping it.

Advantageously, the electrically conductive metal oxide implemented within the scope of the present invention is selected from the group constituted of tin oxide doped with fluorine ($SnO_2$:F), tin oxide doped with arsenic ($SnO_2$:As), tin oxide doped with antimony ($SnO_2$:Sb), indium oxide doped with tin (ITO), indium oxide doped with zinc (IZO) and zinc oxide doped with aluminium (ZnO:Al). In an even more advantageous manner, the conductive metal oxide substrate implemented within the scope of the present invention is an ITO substrate, said substrate being of mainly amorphous structure comprising a mixture of indium(III) oxide ($In_2O_3$) and tin(IV) oxide ($SnO_2$). Typically, the proportion by weight of indium(III) oxide in the ITO substrate is comprised between 80 and 98% and notably is of the order of 90% (i.e. 90%±5%), whereas the proportion by weight of tin(IV) oxide is comprised between 2 and 20% and notably is of the order of 10% (i.e. 10%±5%).

The electrically conductive metal oxide substrate may be in the form of a solid support made of electrically conductive metal oxide or a coating or layer made of electrically conductive metal oxide of a thickness comprised between 50 nm and 1 mm deposited on a solid support made of another material such as crystalline silicon, a plastic, a resin or a glass. The electrically conductive metal oxide substrate implemented within the scope of the present invention may have any size or shape.

Prior to the implementation of the modification method according to the present invention, the surface of the electrically conductive metal oxide substrate may optionally be subjected to cleaning with a solvent such as, for example, acetone or ethanol and/or a detergent such as an industrial detergent of TFD4 type. This cleaning may be carried out under ultrasounds. This cleaning may be completed by a pre-treatment by UV irradiation, by argon plasma and/or by oxygen plasma. These cleaning and pre-treatment steps are used to avoid any pollution or contamination by external agents such as organic pollutants.

"Modifying a surface made of electrically conductive metal oxide" is taken to mean, within the scope of the present invention, subjecting the electrically conductive metal oxide surface to a treatment following which the physical-chemical properties of the electrically conductive metal oxide surface are different from the physical-chemical properties of this same surface before implementation of said treatment. Thus at least one of the properties selected from among the electrical properties, the optical properties, the morphological properties and the chemical properties is modified following the modification method according to the present invention. Advantageously at least two or at least three of the properties listed above are modified. Typically all of the properties listed above are modified following the modification method according to the present invention.

As regards the electrical properties, the surface of the electrically conductive metal oxide substrate such as an ITO surface subjected to the modification method according to the present invention has a sheet resistance at least two times higher, notably at least three times higher and advantageously at least four times higher than the sheet resistance of the same surface not subjected to said modification method. Similarly, the surface of the electrically conductive metal oxide substrate such as an ITO surface subjected to the modification method according to the present invention has a potential difference comprised between 0.2 and 2 V, notably between 0.3 and 1 V and advantageously of the order of 0.5 V (i.e. 0.5 V±0.1 V) with regard to the same surface not subjected to said modification method, the voltage measurements being carried out in open circuit.

As regards the optical properties, the surface of the electrically conductive metal oxide substrate such as an ITO surface subjected to the modification method according to the present invention has a modified absorbance in the visible domain, i.e. different from the absorbance in the visible domain of the same surface not subjected to said modification method. It ensues from this difference of absorbance that the surface of the electrically conductive metal oxide substrate such as an ITO surface subjected to the modification method according to the present invention has a different colour from that of the same surface not subjected to said modification method. Thus, when the electrically conductive metal oxide substrate is an ITO film deposited on crystalline silicon, the surface of such a substrate subjected to the modification method according to the present invention has a light grey colour, whereas the same surface not subjected to said modification method is blue.

As regards the morphological properties, the surface of the electrically conductive metal oxide substrate such as an ITO surface subjected to the modification method according to the present invention is granular compared to the same surface not subjected to said modification method. In fact, when the surface of the electrically conductive metal oxide substrate is an ITO surface, the latter subjected to the modification method according to the present invention has a uniform layer constituted of grains of ITO of which the average diameter is comprised between 50 nm and 300 nm and notably between 80 nm to 200 nm.

As regards the electrical properties, the surface of the electrically conductive metal oxide substrate such as an ITO surface subjected to the modification method according to the present invention has a modified crystallographic structure compared to that of the same surface not subjected to said modification method. Thus, when the surface of the electrically conductive metal oxide substrate is an ITO surface, this substrate subjected to the modification method according to the present invention comprises, apart from ITO, indium in metal form. Typically the quantity of indium metal by weight is comprised between 5 and 25%, notably between 10 and 20% and advantageously of the order of 16% (i.e. 16%±2%) compared to the total weight of the ITO substrate (i.e. ITO+indium metal weight). It should also be noted that the surface of the ITO substrate subjected to the modification method according to the present invention does not have nanoparticles of copper metal or copper oxide.

Step (i) of the method according to the present invention consists in bringing into contact the surface of an electrically conductive metal oxide substrate with a solution, hereafter designated solution $S_1$, containing two distinct elements which are (1) at least one $Cu^{2+}$ ion and (2) at least ammonia then washing and potentially drying the surface of the electrically conductive metal oxide substrate thus obtained. In other words and on the basis of the theoretical explanations above, this step aims to create "ligands" between the $[Cu(NH_3)_4]^{2+}$ complexes and the surface of the electrically conductive metal oxide substrate.

In the solution $S_1$, the $Cu^{2+}$ ion is in the form of a copper salt. This salt is advantageously selected from the group consisting of a nitrate, a sulphate, an acetate, a halide, a tetrafluoroborate and any of the hydrated forms thereof. "Halide" is taken to mean a chloride, a bromide, an iodide or a fluoride. Advantageously, the copper salt implemented is copper sulphate ($CuSO_4$) and notably copper sulphate pentahydrate ($CuSO_4.5H_2O$). The copper salt is present, in the solution $S_1$, in a quantity comprised between 0.05 and 0.25 mol/L and advantageously between 0.06 and 0.2 mol/L.

The solution $S_1$ comprises, in addition to $Cu^{2+}$ ions as described above, ammonia. Typically, ammonia is present, in the solution $S_1$, in a quantity comprised between 1 and 6 mol/L and advantageously between 1.5 and 5 mol/L. Thus, the pH of the solution $S_1$ is advantageously comprised between 10 and 14 and notably between 11 and 13.

The solution $S_1$ comprises, in addition to $Cu^{2+}$ ions and ammonia such as described above, a solvent. This solvent is advantageously water which could be deionised water, distilled water or ultra-pure water (18.2 MΩ). Typically, the solvent in the solution $S_1$ is deionised water. Thus, the solution $S_1$ is an aqueous ammoniacal solution comprising one copper salt and typically only copper sulphate. In the solution $S_1$, ammonia ($NH_3$) is dissolved which, when the solvent of the solution $S_1$, forms a basic aqueous solution of ammonia, designated $NH_3.H_2O$, $NH_4OH$ or even $NH_{3\ aqueous}$.

Advantageously, the solution $S_1$ only comprises a copper salt and ammonia in a solvent. A particular example of this embodiment is an aqueous ammoniacal solution only comprising one copper salt and typically only copper sulphate.

In an alternative, the solution $S_1$ may comprise one or several other element(s) in addition to $Cu^{2+}$ ions, ammonia and solvent. Typically, this other element may be a salt of a bonding metal such as a ferrous salt, a ferric salt, a nickel salt, a cobalt salt or a zinc salt. This bonding metal salt is advantageously selected from the group consisting of a nitrate, a sulphate, an acetate, a halide, a tetrafluoroborate and any of the hydrated forms thereof. As a particular example of such a bonding metal salt which can be present in the solution $S_1$ in addition to $Cu^{2+}$ ions and ammonia, nickel sulphate may be cited.

The solution $S_1$ may be prepared, in an extemporaneous manner or not, from commercially available compounds. In an alternative, this solution may be a commercially available solution such as, for example, the Pegactiv A2 solution of Pegastech.

Step (i) of the method according to the invention is carried out at a temperature comprised between 10° C. and 30° C., advantageously between 15° C. and 25° C. and, more particularly, at room temperature (i.e. 21° C.±3° C.) and generally for 1 min to 1 h, notably for 5 min to 30 min and, in particular, of the order of 15 min (i.e. 15 min±5 min).

The bringing into contact during step (i) may be carried out in static mode or in dynamic mode. In "static mode", also called "batch mode", the surface of the electrically conductive metal oxide substrate is immersed in the solution $S_1$, the latter being potentially subjected to agitation. In the "dynamic mode", also called "column mode", the solution $S_1$ flows over the surface of the electrically conductive metal oxide substrate.

At the end of said bringing into contact, the surface of the electrically conductive metal oxide substrate is subjected to a washing. Such a washing aims to eliminate the copper salt and ammonia in excess as well as $Cu^{2+}$ ions not involved in ligands such as defined previously.

If the bringing into contact has been carried out in static mode, the surface of the electrically conductive metal oxide substrate is removed from the solution $S_1$ then is washed by immersing it in a washing solution or by making the washing solution flow over said surface. If the bringing into contact has been carried out in static mode, the solution $S_1$ flowing over the surface of the electrically conductive metal oxide substrate is replaced by the washing solution.

The washing step and notably when it involves immersing the surface of the electrically conductive metal oxide substrate in a washing solution may be repeated several times and notably at least twice, at least three times or instead at least four times. At each washing, a washing solution, identical or different, may be implemented.

Advantageously, the washing solution used during step (i) comprises the same solvent as the solvent of the solution $S_1$. Typically, this washing solution is deionised water.

Following this washing, the surface of the electrically conductive metal oxide substrate may optionally be subjected to drying, which is not however compulsory.

Step (ii) of the method according to the present invention consists in bringing into contact the surface of the electrically conductive metal oxide substrate obtained following step (i) i.e. the surface of the electrically conductive metal oxide substrate where $[Cu(NH_3)_4]^{2+}$ complexes are bound or adsorbed with a solution, hereafter designated solution $S_2$, comprising sodium tetraborohydride then washing and optionally drying the surface of the electrically conductive metal oxide substrate thus obtained.

In the solution $S_2$ as implemented during step (ii), sodium tetraborohydride is present in a quantity comprised between 0.03 and 0.15 mol/L, advantageously between 0.06 and 0.1 mol/L and, in particular, of the order of 0.08 mol/L (i.e. 0.08 mol/L±0.01 mol/L).

The solution $S_2$ comprises, in addition to sodium tetraborohydride, a solvent. This solvent is advantageously water, which may also be deionised water, distilled water or ultra-pure water. Typically, the solvent in the solution $S_2$ is deionised water.

Step (ii) of the method according to the invention is carried out at a temperature comprised between 30° C. and 60° C., advantageously between 35° C. and 50° C. and, more particularly, at a temperature of the order of 40° C. (i.e. 40° C.±5° C.) and generally for 1 to 15 min, notably for 2 to 10 min and, in particular, of the order of 5 min (i.e. 5 min±2 min).

The bringing into contact during step (ii) is carried out in static mode or in dynamic mode. In "static mode", also called "batch mode", the surface of the electrically conductive metal oxide substrate is immersed in the solution $S_2$, the latter being potentially subjected to agitation. When the solution $S_2$ is subjected to agitation, the latter may involve a mixer, an agitator, a magnetic stirrer bar, an ultrasound bath or a homogeniser. In "dynamic mode" also called "column mode", the solution $S_2$ flows over the surface of the electrically conductive metal oxide substrate.

At the end of said bringing into contact, the surface of the electrically conductive metal oxide substrate is subjected to a washing. Such a washing aims to eliminate the residual elements stemming from the solution $S_2$ or elements stemming from the reaction of sodium tetraborohydride with the complexes present on the surface of the electrically conductive metal oxide substrate.

If the bringing into contact has been carried out in static mode, the surface of the electrically conductive metal oxide substrate is removed from the solution $S_2$ then is washed by immersing it in a washing solution or by making the washing solution flow over said surface. If the bringing into contact has been carried out in static mode, the solution $S_2$ flowing over the surface of the electrically conductive metal oxide substrate is replaced by the washing solution.

The washing step and notably when it involves immersing the surface of the electrically conductive metal oxide substrate in a washing solution may be repeated several times and notably at least twice, at least three times or instead at least four times. At each washing, a washing solution, identical or different, may be implemented.

Advantageously, the washing solution used during step (ii) comprises the same solvent as the solvent of the solution $S_2$. Typically, this washing solution is deionised water.

Following this washing, the surface of the electrically conductive metal oxide substrate may optionally be subjected to drying, which is however not compulsory.

As explained previously, the combination of the two steps of the modification method according to the invention involving a first bath containing copper sulphate and ammonia and a second bath containing sodium tetraborohydride leads to physical-chemical modifications of the surface of the electrically conductive metal oxide substrate which enable good adhesion of the copper metal film electrodeposited on this surface. In this case, the copper metal film is in direct contact with the modified surface of the electrically conductive metal oxide substrate. In other words, no other layer such as a seed layer or an adhesion layer is interposed between the copper metal film and the modified surface of the electrically conductive metal oxide substrate.

Hence, the present invention also relates to a method for forming a copper metal film on the surface of an electrically conductive metal oxide substrate, said method comprising the following steps consisting in:
 a) preparing a surface of an electrically conductive metal oxide substrate modified in accordance with the modification method such as defined previously;
 b) electrodepositing copper metal on the modified surface of the substrate prepared during step (a).

Everything that has been described previously for the modification method according to the present invention applies to step (a) of the method for forming a copper metal film on the surface of an electrically conductive metal oxide substrate.

Step (b) of the method for forming a copper metal film on the surface of an electrically conductive metal oxide substrate is a conventional step in the field of the deposition of metals on conducting or semiconducting surfaces.

"Electrodeposition" is taken to mean a method consisting in covering the surface of a substrate by a metal coating in which the substrate is polarised electrically and placed in contact with a liquid containing precursors of said metal coating in such a way as to form said coating. The terms and expressions "electrodeposition", "electrodeposit" and "electrochemical deposition" are equivalent and can be used in an interchangeable manner.

In the present case, during step (b), the deposition of copper metal is obtained by reduction of copper ($Cu^{2+}$) ions from a solution containing said ions, this reduction being induced by electrons supplied by an external current source. More particularly, the electrodeposition is conducted by passage of a current between the electrically conductive metal oxide substrate to coat constituting the cathode and the inert anode which presents a high surface such as a platinized titanium grid, in a bath containing $Cu^{2+}$ ions and optionally in the presence of a reference electrode.

In the electrodeposition bath implemented within the scope of the present invention, the $Cu^{2+}$ ions are in the form of a copper salt. This salt is advantageously selected from the group consisting of a nitrate, a sulphate, an acetate, a halide, a tetrafluoroborate and any of the hydrated forms thereof. Advantageously, the copper salt implemented is copper sulphate ($CuSO_4$) and notably copper sulphate penta hydrate ($CuSO_4.5H_2O$). The copper salt is present, in the electrodeposition bath, in a quantity comprised between 0.05 and 0.7 mol/L, in particular between 0.1 and 0.5 mol/L, and advantageously between 0.2 and 0.4 mol/L.

Typically, the electrodeposition bath implemented within the scope of the present invention is an aqueous acid solution containing $Cu^{2+}$ ions. Consequently, this electrodeposition bath comprises at least one organic acid, such as acetic acid, or at least one inorganic acid and notably an acid selected from the group consisting of hydrochloric acid (HCl), sulphuric acid ($H_2SO_4$), nitric acid ($HNO_3$), phosphoric acid ($H_3PO_4$) and a mixture thereof. As a particular example of mixtures of acids that can be used within the scope of the present invention, a mixture of hydrochloric acid (HCl) and sulphuric acid ($H_2SO_4$) may be cited.

Finally, the electrodeposition bath implemented within the scope of the present invention may optionally comprise one or several additive(s) intended to improve the properties of the coating formed, such as the regularity and the fineness of the deposition and the resistivity thereof. An example of such an additive is an organic brightening agent such as Copper Gleam PC Additive (Pegastech).

In a particular embodiment of step (b) of the method according to the invention, the latter may notably be conducted by carrying out the following steps:
 a so-called "cold entry" step during which the modified surface of the electrically conductive metal oxide substrate obtained following step (a) is placed in contact without electrical polarisation with an electrodeposition bath and typically maintained in this state for a duration of at least 5 seconds, notably comprised between 10 and 60 seconds, and in particular comprised between 10 and 30 seconds,
 a step of formation of the metal coating during which said surface is polarised for a sufficient duration to form said coating,
 a so-called "hot exit" step, during which said surface is separated from the electrodeposition bath while it is still under electrical polarisation.

Typically, to implement such dispositions, those skilled in the art will usefully refer to the international application WO 2007/034116 [9] and notably to the examples.

During step (b) of the method according to the invention and notably during the step of formation of the coating as defined previously, the surface to coat, i.e. the modified surface of the electrically conductive metal oxide substrate, is polarised in galvanostatic or potentiostatic mode. Said galvanostatic or potentiostatic mode can optionally be pulsed. By way of particular example, a current comprised between 0.1 and 50 $A/dm^2$ and, in particular, between 1 and 5 $A/dm^2$ is applied at the level of the modified surface of the electrically conductive metal oxide substrate and for a duration comprised between 15 min and 2 h and notably between 30 min and 90 min and, in particular, of the order of 1 h (i.e. 1 h±15 min).

After step (b), the method according to the present invention may optionally comprise an annealing step. Advantageously, this step makes it possible to modify the crystallinity of the deposition of copper metal so as to reduce its resistivity and, if necessary, to improve the conformity of the deposition of copper metal. Typically, this annealing step is carried out at a temperature comprised between 30° C. and 80° C., notably between 40° C. and 60° C. and, in particular of the order of 50° C. (i.e. 50° C.±5° C.) and for a duration comprised between 10 min and 1 h and notably between 20 min and 45 min and, in particular, of the order of 30 min (i.e. 30 min±5 min).

In a particular embodiment of the metallisation method according to the present invention, the copper metal film is formed on the surface of the electrically conductive metal oxide substrate according to a predetermined pattern. "Predetermined pattern" is taken to mean, within the scope of the present invention, the deposition of the copper metal film on one (or several) predefined site(s) on the surface of the electrically conductive metal oxide substrate. In other words, only certain sites of the electrically conductive metal oxide surface are coated with a copper metal film and according to a predetermined pattern.

In this embodiment, the method according to the present invention comprises, prior to step (a) such as defined previously, a first step which makes it possible to delimit, on the surface of the electrically conductive metal oxide substrate, one (or several) site(s) that will later be modified according to said step (a) then coated by the film of copper metal according to step (b) as defined previously.

This delimitation step of the method successively implements a photosensitive resin and a photolithography. More particularly, it comprises the steps consisting in depositing on the surface of the electrically conductive metal oxide substrate a layer of photosensitive resin then eliminating, by photolithography, the resin layer at given sites thus creating said pattern.

This embodiment comprises, once step (b) and optionally the annealing step such as defined previously have been carried out, a step consisting in eliminating the remaining photosensitive resin whereby the electrically conductive metal oxide substrate no longer has resin on the surface thereof.

Typically the photosensitive resin is deposited in the form of a thin layer having a substantially uniform thickness, comprised between 10 nm and 100 μm and by dip coating, by spray coating or by spin coating.

The photosensitive resin implemented within the scope of the present invention may be a so-called "positive" resin, that is to say a resin of which the insolated zones are eliminated by the chemical developer, or a so-called "negative" resin, that is to say a resin of which the non-insolated zones are eliminated by the chemical developer.

Any positive or negative photosensitive resin known to those skilled in the art may be used within the scope of the present invention. As non-limiting examples, the resin AZ 4562, the resin TELR-P0003PV (Tokyo OhkaKogyo Co. Ltd) made of propylene glycol monomethyl ether acetate, the resin SU-8 (Shell Chemical) based on octofunctional epoxy with a triarylsulphonium salt as photoinitiator or Novolac type resin, based on phenolformaldehyde with diazonaphtoquinone (DNQ) as photoinitiator, may be cited.

Following the deposition of the photosensitive resin, the latter may be heated to a temperature comprised between 80° C. and 125° C. and notably between 90° C. and 115° C. for a duration depending on the thickness of the layer and generally comprised between 1 and 30 min. This annealing step makes it possible to eliminate the solvent.

The elimination by photolithography consists in irradiating the resin layer by means of a UV radiation through a mask defining insolated zones and non-insolated zones then eliminating either the insolated zones, or the non-insolated zones. Any mask normally used in photolithography may be used within the scope of the present invention. As non-limiting examples, such a mask may be made of quartz and/or chromium.

Typically, the UV irradiation (or UV insolation) is comprised between 100 and 1500 mJ·cm$^2$ and notably between 200 to 1000 mJ·cm$^2$. The UV irradiation may be carried out for a duration comprised between 1 sec and 2 min and notably between 5 sec and 1 min. If need be, a step of annealing the resin may be necessary to complete the photopolymerisation induced by the UV irradiation. This annealing step is carried out, advantageously, between 80° C. and 110° C. and notably between 90° C. and 95° C. for 15 to 30 min.

The insolated zones, i.e. photopolymerised for negative resins, or the non-insolated zones for positive resins become insensitive to a large majority of solvents. Conversely, the insolated zones for positive resins or the non-insolated zones for negative resins may later be dissolved by a solvent, allowing the surface of the substrate to appear at the level of the sites such as defined previously. Those skilled in the art know, as a function of the photosensitive resin used, the solvent, also called the developer, to implement to eliminate certain zones of the resin after the UV irradiation thereof. As non-limiting examples may be cited, as solvent that may be used, tetra methyl ammonium hydroxide (TMA 238), gamma butyrolactone (GBL), propylene glycol methyl ethyl acetate (PGMEA), KOH or NaOH.

Following step (b) or the optionally step of annealing of the copper metal film, the elimination of the remaining photosensitive resin requires the use of a treatment and one (or more) solution(s) or solvent(s) suited for removing the resin and thus for exposing the surface of the electrically conductive metal oxide substrate, without eliminating the deposited copper metal film. Those skilled in the art know the treatments and solutions to use as a function of the resin to eliminate. As examples, such a treatment may be carried out under ultrasounds and using one (or more) bath(s) in a solvent or in several identical or different solvents such as dimethyl sulphoxide, acetone, methanol, ethanol or isopropanol.

The present invention also relates to the modified surface of an electrically conductive metal oxide substrate capable of being obtained following the modification method such as defined previously. The experimental part hereafter clearly shows that the surface of an electrically conductive metal oxide substrate subjected to the modification method according to the invention involving a first bath containing copper sulphate and ammonia and a second bath containing sodium tetraborohydride has physical-chemical modifications that distinguish it from the non-treated surface of the electrically conductive metal oxide substrate.

The present invention also relates to the surface of an electrically conductive metal oxide substrate coated with a copper metal film optionally according to a predetermined pattern capable of being obtained following the metallisation method such as defined previously. By virtue of the implementation of the modification method according to the invention, the surface of the electrically conductive metal oxide substrate coated with a copper metal film is distinguished from surfaces obtained by implementation of methods of the prior art not only by the absence of a seed layer or an adhesion layer but also by the physical-chemical modifications of the surface of the electrically conductive metal oxide substrate induced by the step of modification and which alone make it possible to obtain an adherence never achieved until now of the film of copper metal on said surface.

The modification method according to the present invention is all the more important that it enables the localised modification of the film of electrically conductive metal oxide and notably a film of ITO by transforming the compact deposit into a film constituted of nanoparticles of electrically conductive metal oxide and notably of ITO nanoparticles thus enabling the adherence of an electrolytic deposition of copper. This method constitutes a seminal advance in the field of the photovoltaics industry making it possible to reduce drastically the cost of metallisation of heterojunction PV cells and thus directly their production cost in order to make them competitive in the PV cells market.

Apart from the photovoltaics industry, the present invention may be made useful in any technology using an electrically conductive metal oxide such as ITO such as liquid crystal screens, plasma screens, touch screens; OLEDs; antistatic depositions; optical, reflective coverings, and anti-reflection coatings.

Thus, the present invention relates to the use of a modified surface of an electrically conductive metal oxide substrate such as an ITO substrate capable of being obtained following the modification method such as defined previously or a surface of an electrically conductive metal oxide substrate such as an ITO substrate coated with a copper metal film optionally according to a predetermined pattern capable of being obtained following the metallisation method such as defined previously in the field of photovoltaic cells; liquid crystal screens, plasma screens, touch screens; OLEDs; antistatic depositions as well as optical, reflective coverings, and anti-reflection coatings.

Other characteristics and advantages of the present invention will become clear to those skilled in the art on reading the examples below given for illustrative purposes and which are non-limiting, with reference to the appended figures.

DETAILED DESCRIPTION OF PARTICULAR EMBODIMENTS

I. Metallisation of the ITO Surface According to the Method of the Invention.

I.1. Photolithography Step.

Figure 1A:
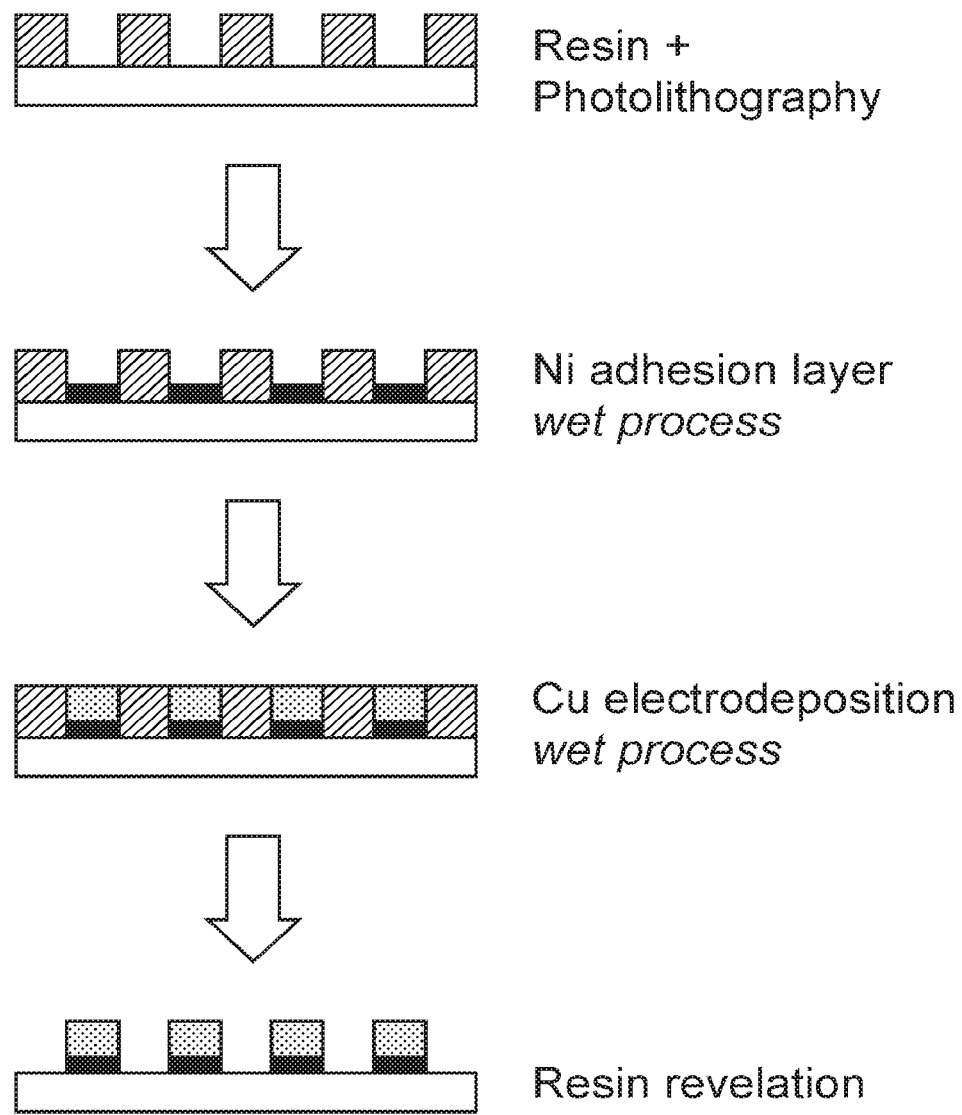
FIGS. 1A and 1B propose a schematic representation of the methods of metallisation of an ITO surface of the prior art, namely the Ni—Cu ECD method (FIG. 1A) and the Cu ECD method (FIG. 1B).
Figure 1B:
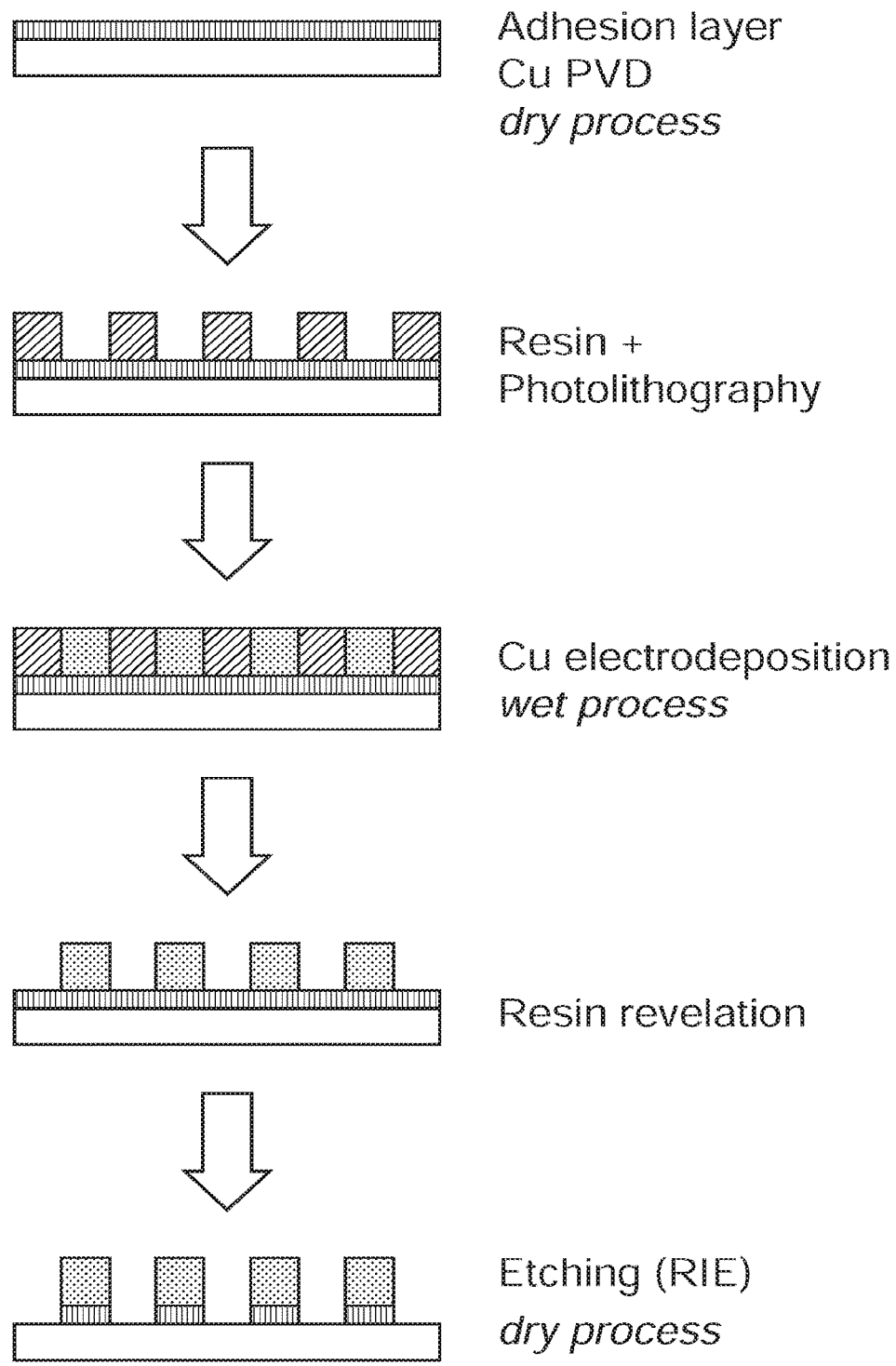
Figure 2:
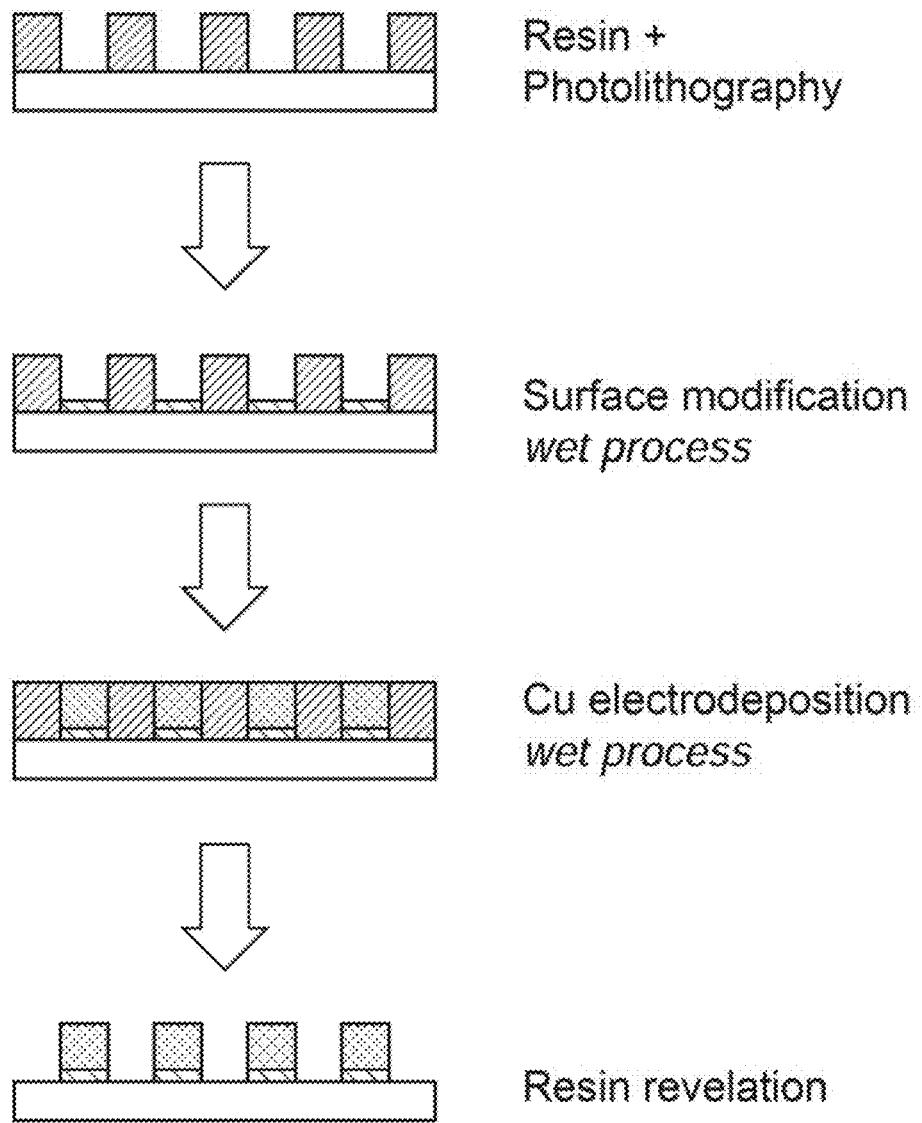
FIG. 2 is a schematic representation of the method of metallisation of an ITO surface according to the present invention.
Figure 3A:
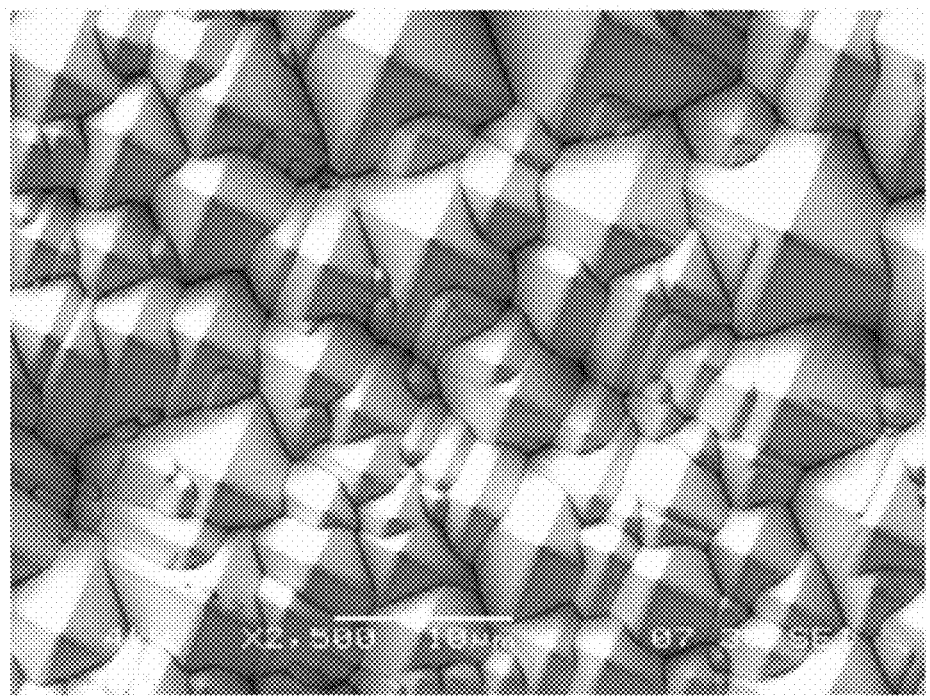
FIGS. 3A and 3B present scanning electron microscopy (SEM) micrographs of a heterojunction PV cell with surface view (FIG. 3A) and profile view highlighting the ITO layer of a thickness of 80 nm (FIG. 3B).
Figure 3B:
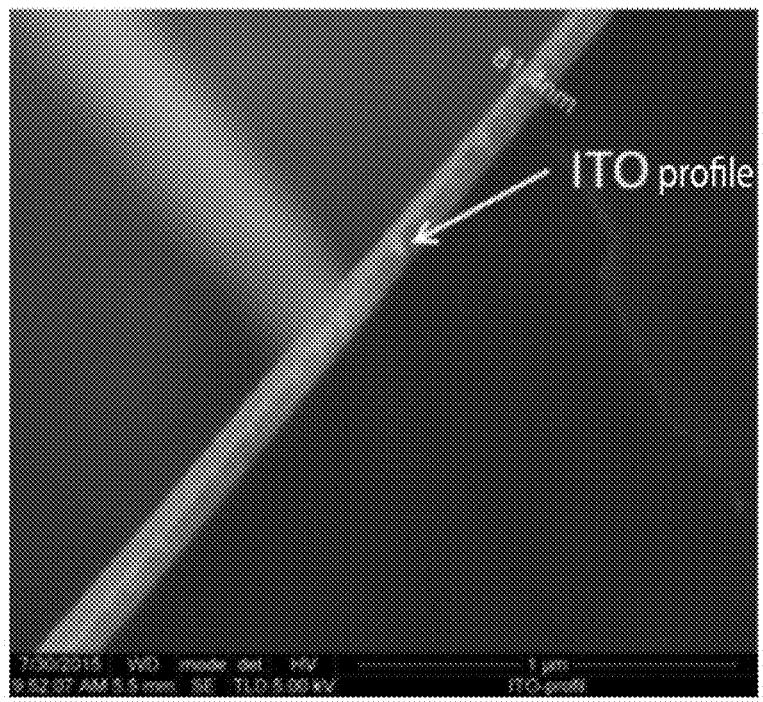

The heterojunction PV cell implemented has on the surface thereof a pyramidal structure (FIG. 3A) stemming from the chemical etching of crystalline silicon. On the surface, the layer of 80 nm of ITO is observed by SEM and illustrated in FIG. 3B.

The heterojunction PV cell has firstly been protected on the rear face by means of a photosensitive resin (positive resin AZ 4562). A mask stemming from the same photosensitive resin was also applied on the front face by photolithography.

I.2. Step of Modification of the ITO Surface.

The heterojunction PV cell photolithographied beforehand is immersed in a bath of Pegactiv A2 (Pegastech), at room temperature, for 15 minutes. This commercially available bath is an alkaline copper solution containing mainly ammonia (<10%), copper sulphate (<10%) and nickel sulphate (<2.5%). This bath was then replaced by other ammoniacal solutions containing only copper sulphate. The concentrations of ammonia used vary from 1.5 mol/L to 5 mol/L and those of $CuSO_2.5H_2O$ vary from 0.06 to 0.2 mol/L. All the solutions used enabled the modification of the ITO with the same efficiency and are stable over time.

Once the $1^{st}$ bath carried out, the heterojunction PV cell is rinsed with deionised water.

The heterojunction PV cell is next immersed in an aqueous solution containing 0.08 M of sodium tetra borohydride ($NaBH_4$, Sigma Aldrich ≥96%), at 40° C., for 5 minutes. The surface of the cell goes rapidly from the original blue to light grey.

Once the $2^{nd}$ bath carried out, the heterojunction PV cell is also rinsed with deionised water.

I.3. Step of Electrodeposition of Copper.

Once the ITO modification method has been carried out, the cell is next immersed in the copper electrodeposition bath.

In order to apply the current necessary for the reduction of $Cu^{2+}$ ions into particles of copper metal on the ITO surface, the cell is connected by means of two contact pick-ups situated at the edge thereof.

The current applied is characteristic of the bath used and is 2.5 A/dm$^2$ for a given rate of growth of the film of 0.5 µm/min. The anode used is a platinized titanium grid anode. The electrodeposition bath is constituted of 75 g/L of copper sulphate pentahydrate ($CuSO_4.5H_2O$, Sigma Aldrich), 180 g/L of sulphuric acid ($H_2SO_4$, (Sigma Aldrich), 70 ppm of hydrochloric acid (HCl, Sigma Aldrich) and 2.5 ml/L of an organic brightening agent (Copper Gleam PC Additive, Pegastech).

The cell is then metallised by electrodeposition of copper at 2.5 A/dm$^2$ for 1 hour. It is then removed from the bath and rinsed with deionised water. An annealing of 30 minutes at 50° C. is finally applied.

Figure 4A:
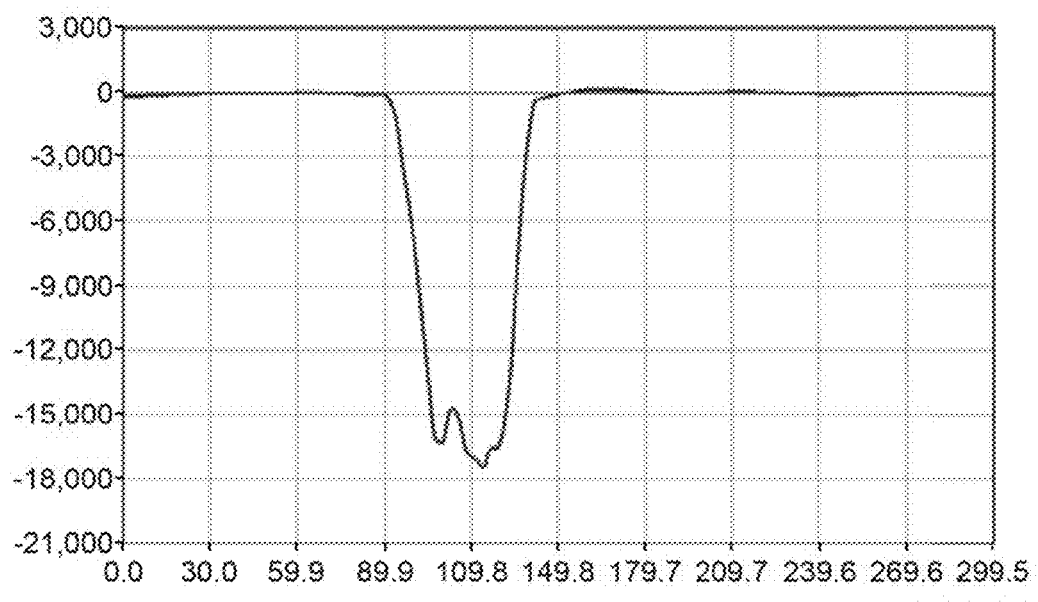
FIGS. 4A and 4B present the profilometry of a line of the mask photolithographied on the heterojunction PV cell before electrodeposition (FIG. 4A) and after electrodeposition (FIG. 4B).
Figure 4B:
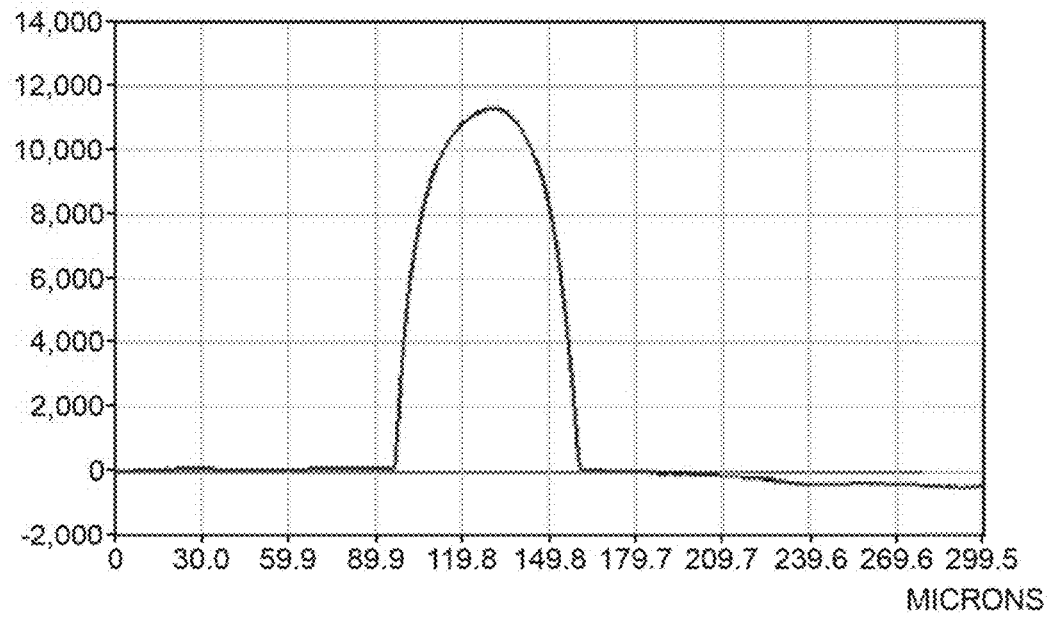

The thickness of the copper film produced is controlled by profilometry. The lines measure around 15 urn deep before metallisation (FIG. 4A) whereas, after metallisation, the photolithographied mask is entirely filled with dense copper metal (FIG. 4B).

I.4. Resin Revelation Step.

The final step is the revelation of the photolithography mask. The cell is immersed successively and for several minutes in two baths of dimethyl sulphoxide (Sigma Aldrich), then in a bath of ethanol (Sigma Aldrich) and finally in a bath of isopropanol (Sigma Aldrich). The cell is finally dried under a slight current of nitrogen, then in an oven at 50° C. for 10 minutes.

II. Characterisation of the Surfaces Obtained.

II.1. Characterisation of the ITO Surface Obtained Following Step I.2.

Once the heterojunction PV cell has been immersed successively in the two baths (step I.2 as defined previously), its surface rapidly goes from the original blue to a light grey.

By way of comparison, a non-treated cell sample (ITO ref), a cell sample treated uniquely with the ammoniacal solution only containing copper sulphate (ITO-CuSO$_4$/NH$_4$OH) and a cell sample treated uniquely with the solution of NaBH$_4$ (ITO-NaBH$_4$) are used. This latter sample was used notably with the goal of determining whether the 2$^{nd}$ bath damaged the optical and electrical properties of the ITO.

Sheet resistance measurements using a 4-point measurement system were carried out on the samples and the values are grouped together in Table 1. Only the sample having undergone the two steps of the modification method according to the invention (ITO-CuSO$_4$/NH$_4$OH—NaBH$_4$) show a resistance 4 times higher (328.4Ω/□) compared to the other samples (79-80Ω/□). The electrical properties of the ITO are thus not modified by the single bath of NaBH$_4$ but by the association of the two successive baths.

TABLE 1

Sheet resistance measurements of the samples.

| Samples | R (Ω/□) |
|---|---|
| ITO ref | 79.38 |
| ITO-CuSO$_4$/NH$_4$OH | 79.88 |
| ITO-NaBH$_4$ | 79.95 |
| ITO-CuSO$_4$/NH$_4$OH—NaBH$_4$ | 328.4 |

Figure 5:
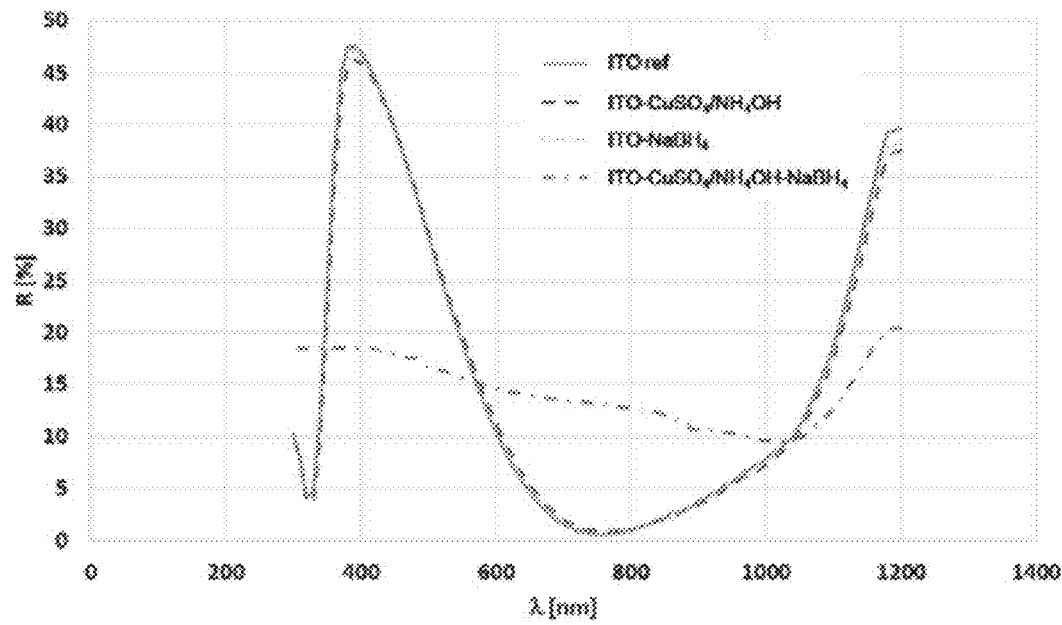
FIG. 5 presents the UV spectra of a non-treated sample of heterojunction PV cell (ITO ref), a sample treated uniquely with the ammoniacal solution only containing copper sulphate (ITO-$CuSO_4$/$NH_4OH$), a sample of cell treated uniquely with the solution of $NaBH_4$ (ITO-$NaBH_4$) and a sample treated in accordance with the method according to the invention (ITO-$CuSO_4$/$NH_4OH$—$NaBH_4$).

The solution of NaBH$_4$ does not modify either the optical properties of the ITO. The UV-visible spectrum remains unchanged for ITO-CuSO$_4$/NH$_4$OH and ITO-NaBH$_4$ (FIG. 5). Only the association of the two steps of the modification method according to the invention modifies the absorbance of the ITO in the visible domain.

The surface modification produced on the ITO is thus made possible exclusively thanks to two successive baths: the CuSO$_4$—NH$_4$OH solution (ammoniacal copper) and the solution containing NaBH$_4$.

In order to show the influence of copper sulphate independently of ammonia, samples of non-textured monocrystalline silicon and covered with a deposition of ITO of 100 nm of thickness were immersed in an aqueous solution containing copper sulphate and/or containing ammonia.

These samples designated ITO (reference), ITO-CuSO$_4$ (copper sulphate alone), ITO-NH$_4$OH (ammonia alone) and ITO-CuSO$_4$/NH$_4$OH (solution containing copper sulphate and ammonia) were subjected to an electrochemical analysis by OCP (Open Circuit Potential). The open circuit voltage (without application of current), was measured directly in the solution containing NaBH$_4$ at 40° C.

Figure 6:
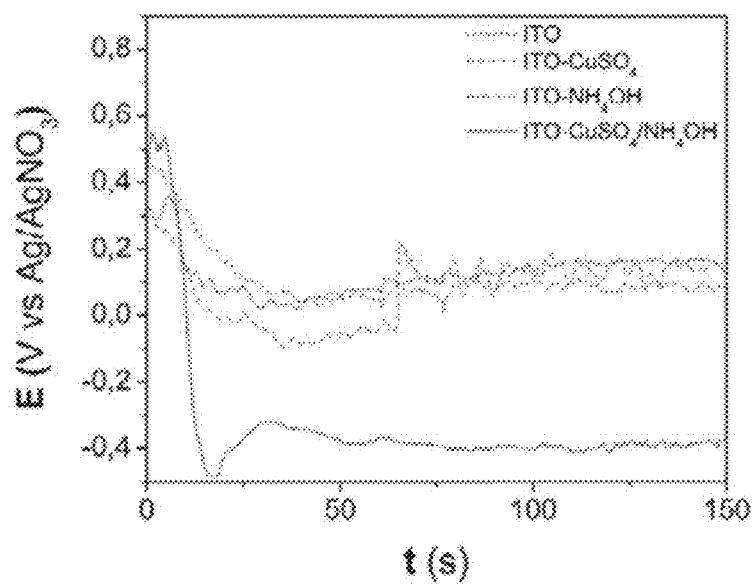
FIG. 6 presents the OCP (Open Circuit Potential) measurements on Si of the ITO samples alone (ITO), ITO treated by copper sulphate alone (ITO-$CuSO_4$), ITO treated by ammonia alone (ITO-$NH_4OH$) and ITO treated by a solution containing copper sulphate and ammonia (ITO-$CuSO_4$/$NH_4OH$).

The voltage measurements in open circuit presented in FIG. 6 reveal an identical potential for ITO, ITO-CuSO$_4$ and ITO-NH$_4$OH of around E=0.1 V and a potential difference of around ΔE=0.5 V between ITO and ITO-CuSO$_4$/NH$_4$OH. This potential difference shows that in the presence of NaBH$_4$, a surface reaction only takes place in the presence of both CuSO$_4$ and NH$_4$OH.

This surface modification reaction of the ITO thus involves copper-ammonia [Cu(NH$_3$)$_4$]$^{2+}$ complexes. To date, the functioning of this step remains unknown.

Figure 7A:
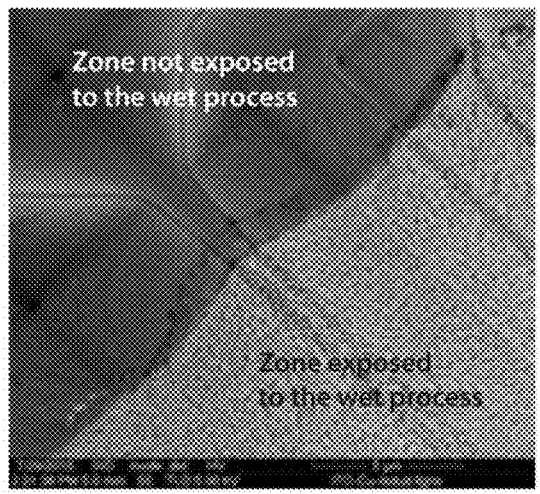
FIGS. 7A, 7B, and 7C present SEM micrographs of a sample of cell modified according to the method of the invention, i.e. immersed in the ammoniacal solution of Cu(II) then in the solution of $NaBH_4$, with the surface of a line after treatment (FIG. 7A), highlighting the surface structuring (FIG. 7B) and the profile of the ITO layer thus modified (FIG. 7C).
Figure 7B:
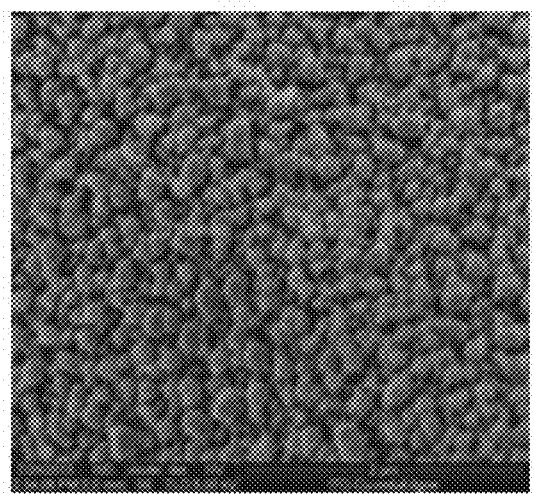
Figure 7C:
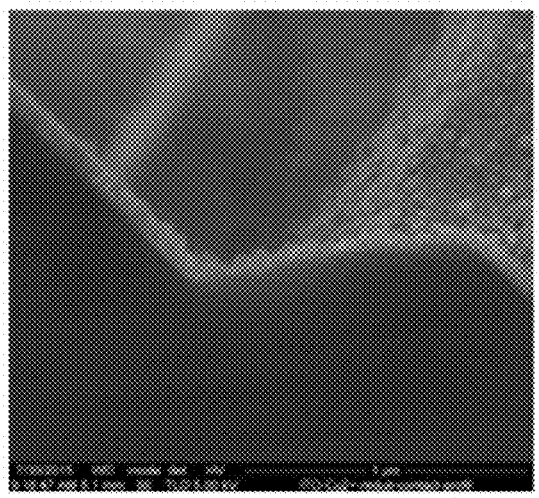
Figure 8A:
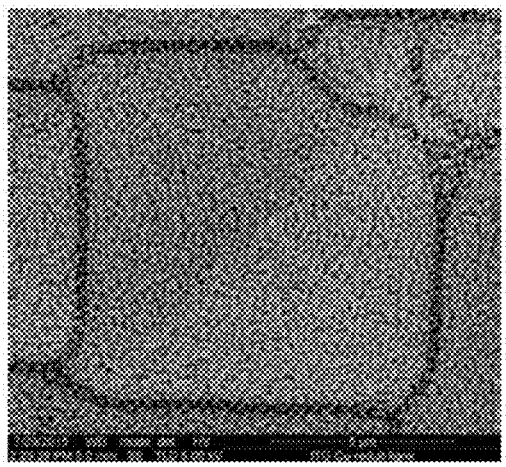
FIGS. 8A, 8B, and 8C present SEM micrographs of a sample of cell modified according to the method of the invention, i.e. immersed in the ammoniacal solution of Cu(II) then in the solution of $NaBH_4$, with surface views at different enlargements (FIGS. 8A and 8B) as well as the energy dispersive (EDX) analysis spectrum associated with the SEM micrograph of FIG. 8B (FIG. 8C).
Figure 8B:
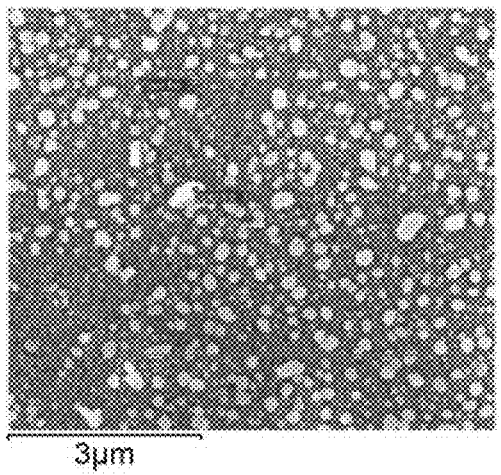

The ITO surface that has undergone the two steps of the modification method according to the invention is thus the only one to show differences at the electrical and optical level. FIG. 7A shows an open line of the photolithography mask after treatment, a clear boundary is observed between the zone protected by the resin during treatment and the zone having reacted to the two successive baths. The zoom made on this zone (FIG. 7B, FIG. 8A and FIG. 8B) shows a uniform layer constituted of grains of 80 nm to 200 nm diameter. The profile SEM micrograph, presented in FIG. 7C, shows a layer of ITO which is granular compared to the initial deposition of ITO.

Figure 8C:
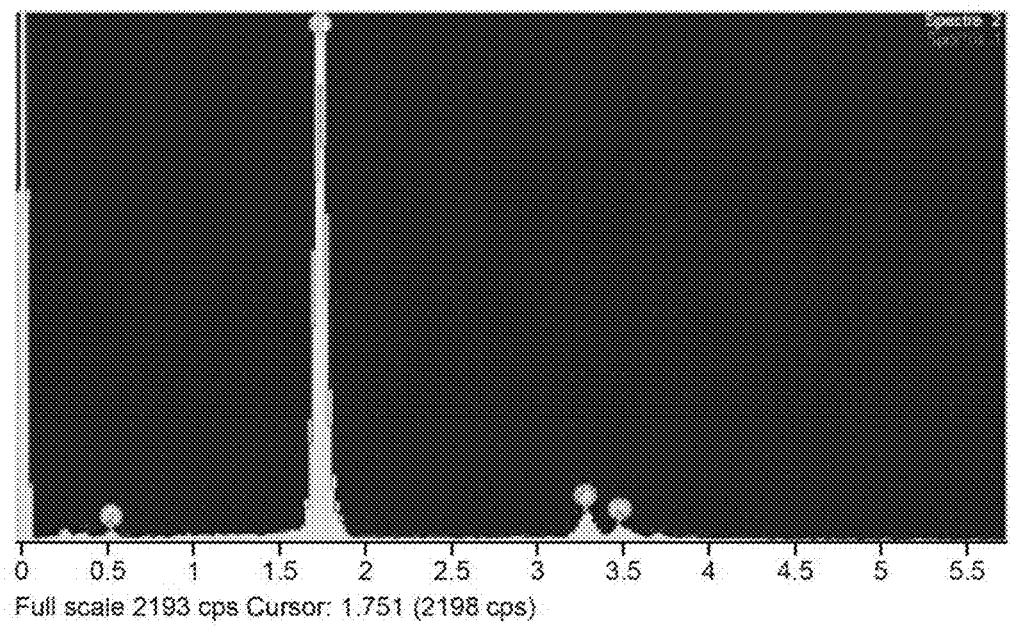

The EDX analysis presented in FIG. 8C shows that the structured layer is constituted exclusively of ITO. No energy peak associated with copper was observed. The method according to the invention has thus modified the physical-chemical properties of the ITO film.

Figure 9:
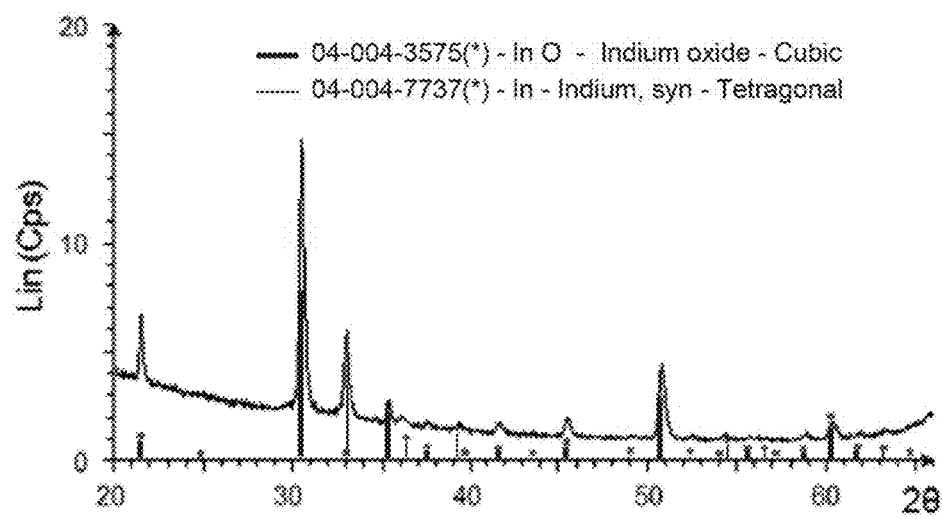
FIG. 9 presents an X-ray diffractometry (XRD) analysis of a deposition of ITO on Si having undergone the surface modification treatment according to the invention.

The morphological modification of the deposition of ITO has been highlighted by SEM and EDX. To study the change of structure of the ITO, X-ray diffraction analyses were carried out at grazing angle on a sample of non-textured silicon, covered with ITO and having been immersed successively in the two baths. FIG. 9 represents the XRD diagram of the modified ITO sample.

Analysis by X-ray diffraction shows that the crystallographic structure of the ITO deposition is modified. In addition to ITO, centred quadratic indium metal (reference ICDD 04-004-7737) is highlighted. Taking into account the intensity of the main rays of each of the two compounds (ray (222) for ITO and ray (101) for indium), the composition by weight of each of the two phases in the deposition was estimated at 16% for indium metal and 84% for ITO. It may thus be affirmed that the action alone of each of the two baths does not modify the structure of the ITO deposition, but that their successive action makes it possible to reduce around 16% of indium in the metal form thereof.

The combination of the different analyses carried out has made it possible to note a real modification of the ITO deposition. The modified ITO sample shows changes not only of the optical and electrical properties thereof, but also the morphological properties thereof: the surface becomes granular, which increases the specific surface; and of the chemical properties thereof: presence of indium metal within the ITO deposition.

The inventors have also been able to show that copper sulphate and ammonia, used independently, had no effect on the transformation of the ITO. Only the action of copper-ammonia complexes such as $[Cu(NH_3)_4]^{2+}$ is efficient. The most probable hypothesis could be that these complexes, under the action of $NaBH_4$, play a role of catalyst, thus enabling a transfer of energy capable of modifying the ITO deposition.

II.2. Characterisation of the Electrodeposition of Copper on an ITO Surface Obtained Following Step I.4.

Figure 10:
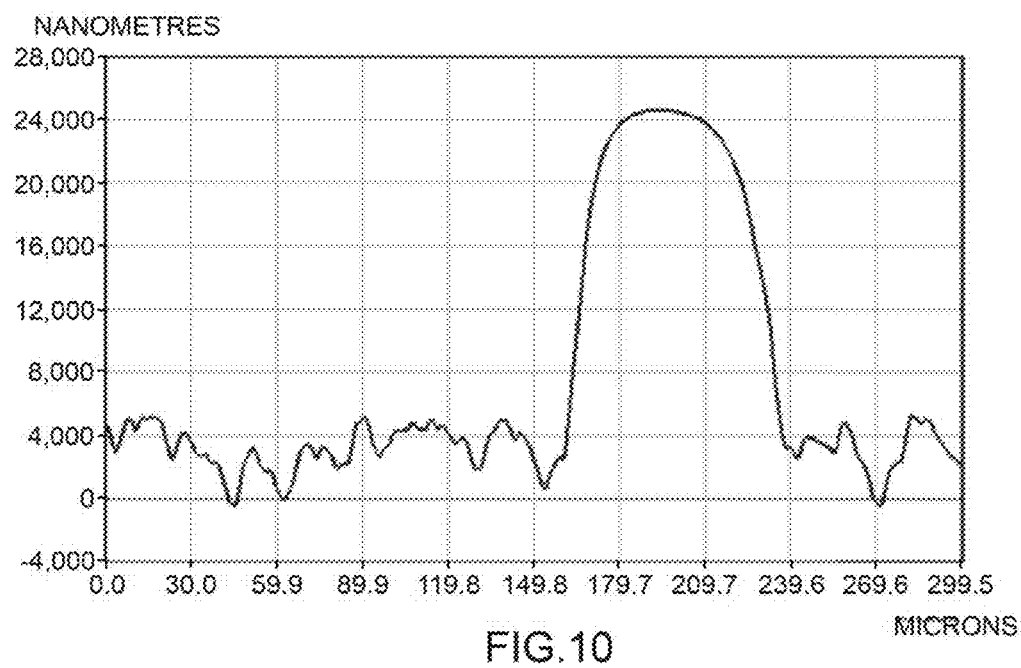
FIG. 10 presents the profilometry of a copper line on heterojunction PV cell formed by electrodeposition following the implementation of the method according to the invention.

The line thicknesses of copper metal obtained following the implementation of the method defined in paragraphs I.1 to I.4 above, controlled by profilometry, are comprised between 18 and 24 μm (FIG. 10).

Figure 11A:
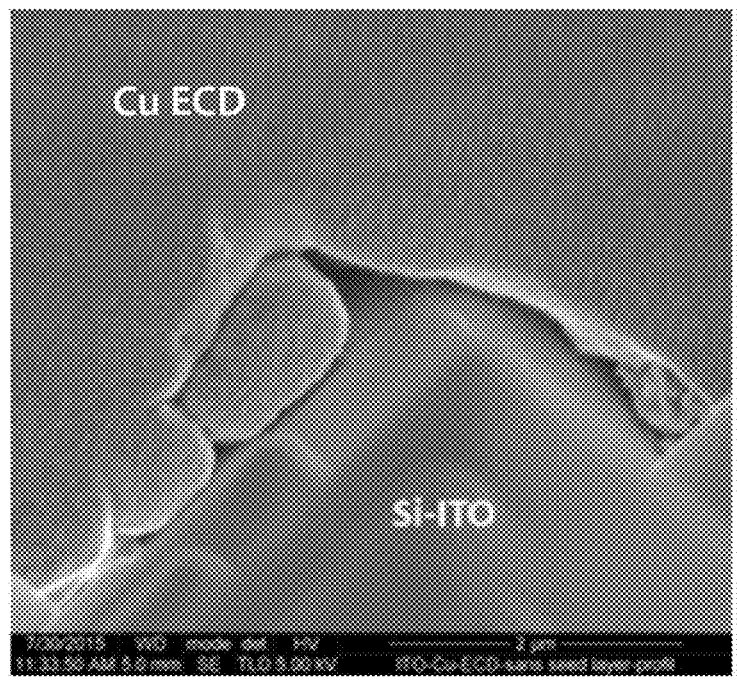
FIGS. 11A and 11B present the characterisation by SEM microscopy of an electrodeposition of copper on ITO without modification of the ITO surface (FIG. 11A) and of an electrodeposition of copper on ITO following the modification of the ITO surface in accordance with the method of the invention (FIG. 11B).

By way of comparison, FIG. 11A shows a profile micrograph of an electrodeposition of copper carried out on a heterojunction PV cell without modification of the latter, the empty zones present at the interface show perfectly the absence of a veritable contact between the copper and the ITO inducing a loss of adherence and a poor electrical contact.

Figure 11B:
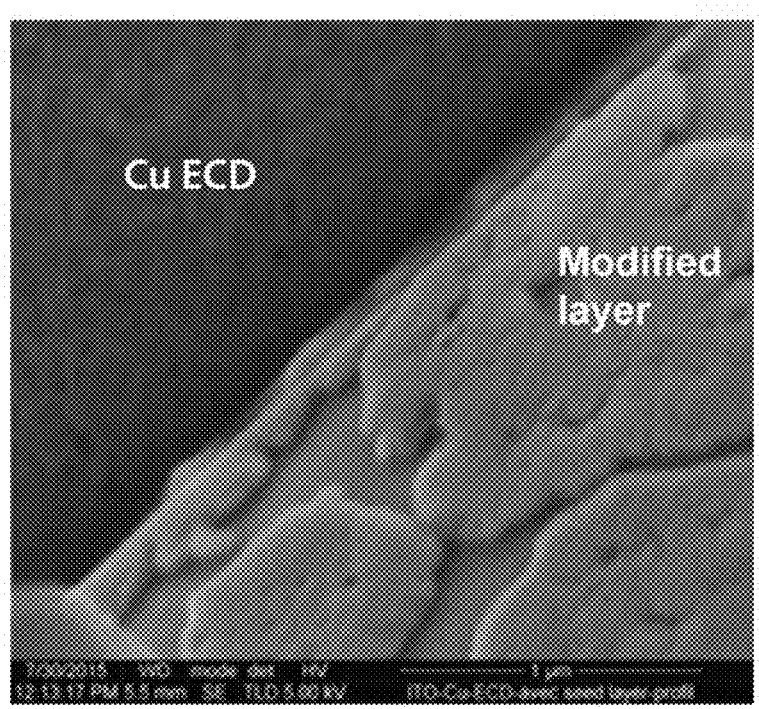
Figure 12A:
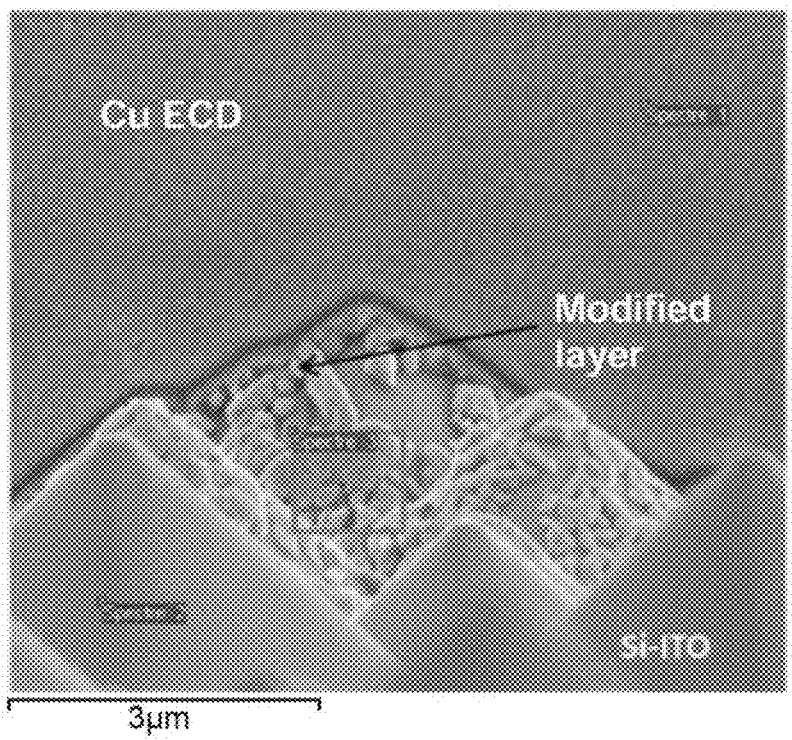
FIGS. 12A and 12B present the SEM (FIG. 12A) and EDX (FIG. 12B) analyses of the interface between a line of copper formed by the metallisation method according to the invention and the ITO film at the surface of the heterojunction PV cell.
Figure 12B:
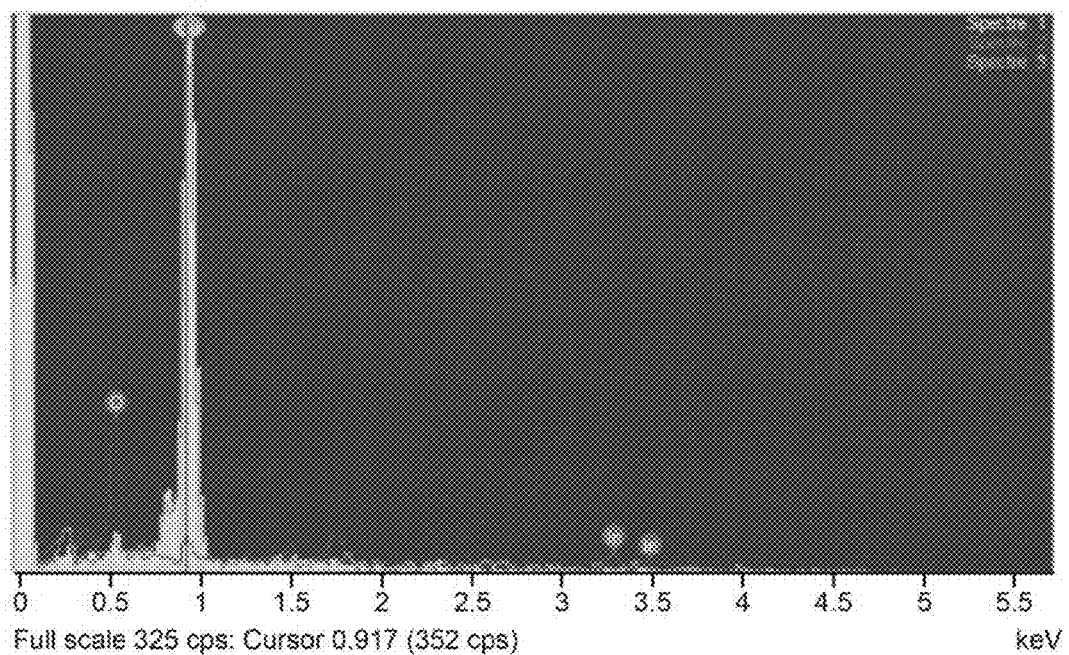

On the contrary, FIG. 11B shows a profile micrograph of the electrodeposition of copper on a heterojunction PV cell using the method of the invention i.e. with modification of the ITO surface. A layer corresponding to the modification of the ITO surface and serving as adhesion layer is present. It thus enables good adherence of the metal on the ITO, which generates an electrical contact of very good quality. The presence of this adhesion layer is revealed by SEM (FIG. 12A) and by EDX analyses, (FIG. 12B).

Once the method of metallisation of the cell was finished, contact resistance measurements were carried out. The measurements presented in Table 2 hereafter show that even if the Cu-ITO contact resistances of the cells metallised in accordance with the method according to the invention are of the order of 10 times greater than the reference values obtained for cells metallised according to the Cu ECD method (reference method), they remain all the same low and testify to a good electrical contact at the Cu-ITO interface.

TABLE 2

TLM measurements determining the Cu-ITO contact resistance

| | Sheet R Rsheet (Ohm) | Contact R Rc (Ohm) | Specific contact R Rhoc (Ohm · cm²) | Width of a plot Lt (μm) |
|---|---|---|---|---|
| Invention method Cell 1 | 76 | 1.26 | 8.43E−03 | 99 |
| Invention method Cell 2 | 78 | 2.02 | 1.38E−03 | 99 |
| Cu ECD method | 57 | 0.0989 | 1.71E−04 | 17 |

Tests of the electrical performances of the cells were finally carried out after laser cutting of the cells. The laser cutting defines around the grid an active surface of 107 cm², in order to insulate the active part or the metal grid from the front contact. The electrical efficiencies are very satisfactory (above 20%), and comparable to those obtained by the Cu ECD method. The electrical characteristics of the cells tested are grouped together in Table 3 below.

TABLE 3

Electrical measurements I(V) on heterojunction PV cells with front contact made of copper by the method according to the invention and the Cu ECD method (reference protocol).

| | Plate | 1 sun IV curve | | | |
|---|---|---|---|---|---|
| | | Voc [mV] | Jsc [mA · cm⁻²] | FF [%] | η [%] |
| Invention method | Cell 1 | 723.9 | 37.4 | 77.9 | 21.1 |
| Invention method | Cell 2 | 714.1 | 37.4 | 77.0 | 20.6 |
| Invention method | Mean | 719.0 | 37.4 | 77.5 | 20.9 |
| Cu ECD method | Mean | 714.1 | 37.4 | 78.1 | 20.8 |

BIBLIOGRAPHIC REFERENCES

[1] Bartsch et al, 2014, "21.8% Efficient n-type Solar Cells with Industrially Feasible Plated Metallization", Energ. Proc., vol. 55, pages 400-409.
[2] Geisler et al, 2014, "Continuous wave laser processing for electrical and mechanical stable solar cells with Ni—Cu metallization", 4th International Conference on Silicon Photovoltaics, SiliconPV, Energ. Proc., vol. 55, pages 665-669.
[3] Hernandez et al, 2013, "High efficiency copper electroplated heterojunction solar cells and modules—the path towards 25% cell efficiency", 28th European Photovoltaic Solar Energy Conference and Exhibition.
[4] Tous et al, 2014, "Large-area hybrid silicon heterojunction solar cells with Ni/Cu plated front contacts", 4th International Conference on Silicon Photovoltaics, SiliconPV, Energ. Proc., vol. 55, pages 715-723.
[5] Geissbuhler et al, 2014, "Silicon Heterojunction Solar Cells With Copper-Plated Grid Electrodes: Status and Comparison With Silver Thick-Film Techniques", IEEE J. of Photovolt., vol. 4, pages 1055-1062.
[6] Papet et al, 2013, "Heterojunction solar cells with electroplated Ni/Cu front electrode", 28th European Photovoltaic Solar Energy Conference and Exhibition.
[7] Masuko et al, 2014, "Achievement of more than 25% conversion efficiency with crystalline silicon heterojunction solar cell", IEEE J. Photovolt., vol. 4, pages 1433-1435.
[8] Khanna et al, 2015, "Screen-printed masking of transparent conductive oxide layers for copper plating of silicon heterojunction cells", Appl. Surf. Sci., vol. 349, pages 880-886.
[9] International application WO 2007/034116 in the name of Alchimer, published on 29 Mar. 2007.

The invention claimed is:

1. Method for modifying the surface of an Indium Tin Oxide (ITO) substrate, said method comprising the following steps consisting in:
   i) bringing into contact the surface of said ITO substrate with a solution containing at least one copper ion ($Cu^{2+}$) and at least ammonia then washing and optionally drying the surface of said ITO substrate thus obtained;
   ii) bringing into contact the surface of said ITO substrate obtained following step (i) with a solution containing sodium tetraborohydride then washing and optionally drying the surface of said ITO substrate, whereby the ITO substrate surface that is obtained after step (ii) is a modified surface that does not present nanoparticles or clusters of copper.

2. Method according to claim 1, characterised in that, during said step (i), the $Cu^{2+}$ ion is, in said solution, in the form of a copper salt.

3. Method according to claim 2, characterised in that said copper salt is present, in said solution, in a quantity comprised between 0.05 and 0.25 mol/L.

4. Method according to claim 1, characterised in that, during said step (i), ammonia is present, in said solution, in a quantity comprised between 1 and 6 mol/L.

5. Method according to claim 1, characterised in that said step (i) is carried out at a temperature comprised between 10° C. and 30° C.

6. Method according to claim 1, characterised in that, during said step (ii), sodium tetraborohydride is present in a quantity comprised between 0.03 and 0.15 mol/L.

7. Method according to claim 1, characterised in that said step (ii) is carried out at a temperature comprised between 30° C. and 60° C.

8. Method for forming a film of copper metal on the surface of an electrically conductive metal oxide substrate, said method comprising the following steps consisting in:
   a) preparing a surface of an electrically conductive metal oxide substrate modified in accordance with the modification method such as defined in claim 1;
   b) electrodepositing copper metal on the surface of the modified substrate prepared during said step (a).

9. Method according to claim 8, characterised in that said step (b) implements an electrodeposition bath comprising $Cu^{2+}$ ions being in the form of a copper salt.

10. Method according to claim 9, characterised in that said electrodeposition bath is an aqueous acid solution containing $Cu^{2+}$ ions.

11. Method according to claim 8, characterised in that the film of copper metal is formed on the surface of the electrically conductive metal oxide substrate according to a predetermined pattern and in that said method comprises:
   prior to said step (a), steps consisting in depositing on the surface of the electrically conductive metal oxide substrate a layer of photosensitive resin then eliminating, by photolithography, the resin layer at given sites thus creating said pattern and
   once said step (b) has been carried out, a step consisting in eliminating the remaining photosensitive resin whereby the electrically conductive metal oxide substrate no longer has resin on the surface thereof.

12. Method according to claim 1, characterised in that, during said step (i), the $Cu^{2+}$ ion is, in said solution, selected from a group consisting of a nitrate, a sulphate, an acetate, a halide, a tetrafluoroborate and any of the hydrated forms thereof.

13. Method according to claim 2, characterised in that said copper salt is present, in said solution, in a quantity comprised between 0.06 and 0.2 mol/L.

14. Method according to claim 1, characterised in that, during said step (i), ammonia is present, in said solution, in a quantity comprised between 1.5 and 5 mol/L.

15. Method according to claim 1, characterised in that said step (i) is carried out at a temperature comprised between 15° C. and 25° C. for 15 min.

16. Method according to claim 1, characterised in that, during said step (ii), sodium tetraborohydride is present in a quantity of 0.08 mol/L.

17. Method according to claim 1, characterised in that said step (ii) is carried out at a temperature of 40° C. for 5 min.

* * * * *